(12) United States Patent
Ji

(10) Patent No.: US 12,363,859 B2
(45) Date of Patent: Jul. 15, 2025

(54) STORAGE DEVICE AND COOLING SYSTEM OF THE STORAGE DEVICE WITH SPIRALLY GUIDE MEMBERS

(71) Applicant: SAMSUNG ELECTRONICS CO., LTD., Suwon-si (KR)

(72) Inventor: Soo-Young Ji, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 331 days.

(21) Appl. No.: 17/984,382

(22) Filed: Nov. 10, 2022

(65) Prior Publication Data
US 2023/0141775 A1   May 11, 2023

(30) Foreign Application Priority Data

Nov. 11, 2021  (KR) ................. 10-2021-0154788
Feb. 22, 2022  (KR) ................. 10-2022-0022820

(51) Int. Cl.
*H05K 7/20*  (2006.01)
*H01L 23/473* (2006.01)
*H10H 20/858* (2025.01)

(52) U.S. Cl.
CPC ....... *H05K 7/20272* (2013.01); *H01L 23/473* (2013.01); *H10H 20/858* (2025.01); *H05K 7/20218* (2013.01); *H05K 7/20345* (2013.01)

(58) Field of Classification Search
CPC ........... H05K 7/20218; H05K 7/20763; H05K 7/20872; H05K 7/20327; H05K 7/20345; G06F 1/20; G06F 2200/201; H01L 23/473; H01L 33/64; H01L 23/34–4735

USPC ........................................................ 361/717
See application file for complete search history.

(56) References Cited

U.S. PATENT DOCUMENTS

| | | | |
|---|---|---|---|
| 5,220,804 A | 6/1993 | Tilton et al. | |
| 5,539,617 A * | 7/1996 | Bochtler | H01L 23/473 |
| | | | 257/E23.098 |
| 6,550,263 B2 | 4/2003 | Patel et al. | |
| 8,014,150 B2 | 9/2011 | Campbell et al. | |
| 9,250,024 B2 | 2/2016 | Campbell et al. | |
| 9,516,792 B2 | 12/2016 | Krishnan et al. | |
| 10,111,367 B2 | 10/2018 | Kodama et al. | |
| 2006/0144568 A1* | 7/2006 | Crocker | F04D 13/0646 |
| | | | 257/E23.098 |
| 2006/0144569 A1* | 7/2006 | Crocker | F28F 3/12 |
| | | | 257/E23.098 |

(Continued)

*Primary Examiner* — Jayprakash N Gandhi
*Assistant Examiner* — Steven Ngo
(74) *Attorney, Agent, or Firm* — MORGAN, LEWIS & BOCKIUS LLP

(57) ABSTRACT

A storage device includes: a memory device; a memory controller; and a cooling unit configured to guide a flow of a cooling material to the memory controller, wherein the cooling unit includes a housing, a guide member, and a pump, wherein the housing covers the memory controller and includes a first point and a second point, wherein the first point is disposed at a first side of the housing, wherein the second point is disposed at a second side of the housing that is below the first side of the housing, wherein the guide member is attached to the housing and guides the flow of the cooling material from the first point toward the second point, and wherein the pump is configured to adjust an amount of the cooling material flowing from the first point to the second point.

18 Claims, 13 Drawing Sheets

(56) References Cited

U.S. PATENT DOCUMENTS

| | | | |
|---|---|---|---|
| 2007/0000268 A1* | 1/2007 | Crocker | F04D 29/588 |
| | | | 257/E23.098 |
| 2007/0000648 A1* | 1/2007 | Crocker | H01L 23/3672 |
| | | | 257/E23.098 |
| 2008/0310114 A1* | 12/2008 | Pawlenko | H05K 9/0049 |
| | | | 361/818 |
| 2014/0254279 A1* | 9/2014 | Cudak | G11C 16/349 |
| | | | 365/185.18 |

* cited by examiner

STORAGE DEVICE AND COOLING SYSTEM OF THE STORAGE DEVICE WITH SPIRALLY GUIDE MEMBERS

CROSS-REFERENCE TO RELATED APPLICATION

This application claims priority under 35 U.S.C. 119(a) to Korean Patent Application No. 10-2021-0154788, filed on Nov. 11, 2021, and Korean Patent Application No. 10-2022-0022820, filed on Feb. 22, 2022, in the Korean Intellectual Property Office, the disclosures of which are incorporated by reference herein in their entireties.

TECHNICAL FIELD

The present inventive concept relates to a storage device and a cooling system of the storage device.

DISCUSSION OF THE RELATED ART

A storage device may be a solid state drive (SSD), and, generally, is a device which receives data from the outside (e.g., an external device) and stores the received data. Such a storage device is widely used not only in traditional electronic devices such as desktop personal computers (PCs), tablet PCs, laptop PCs, and the like but also in electronic devices related to mobility such as automobiles, drones, aircraft, and the like.

In addition, since the operation of the storage device may be continuous or for very long periods of time, a temperature of the storage device may increase. Due to the increased temperature of the storage device, a defect may occur in the storage device. Such a defect of the storage device may adversely affect the reliability of a memory system.

In addition, to address and possibly prevent the defect caused by the increased temperature of the storage device and to maintain the reliability of the system, various methods of cooling the storage device have been under development.

SUMMARY

The present inventive concept is directed to providing a storage device capable of more effectively cooling a memory controller.

The present inventive concept is directed to providing a cooling system of a storage device capable of more effectively cooling a memory controller.

According to an embodiment of the present disclosure, there is a storage device According to an exemplary embodiment of the present inventive concept, a storage device includes: a memory device; a memory controller; and a cooling unit configured to guide a flow of a cooling material to the memory controller, wherein the cooling unit includes a housing, a guide member, and a pump, wherein the housing covers the memory controller and includes a first point and a second point, wherein the first point is disposed at a first side of the housing, wherein the second point is disposed at a second side of the housing that is below the first side of the housing, wherein the guide member is attached to the housing and guides the flow of the cooling material from the first point toward the second point, and wherein the pump is configured to adjust an amount of the cooling material flowing from the first point to the second point.

According to an exemplary embodiment of the present inventive concept, a storage device includes: a memory device; a memory controller; and a cooling unit configured to guide a flow of a cooling material to the memory controller, wherein the cooling unit includes a housing, a guide member, and a pump, wherein the housing covers the memory controller, wherein the guide member is attached to the housing and configured to spirally guide the flow of the cooling material so that the flow of the cooling material is directed toward the memory controller, and wherein the pump is configured to adjust an amount of the cooling material.

According to an exemplary embodiment of the present inventive concept, a cooling system of a storage device includes: a memory device; a memory controller; and a cooling unit configured to guide a flow of a cooling material to the memory controller, wherein the cooling unit includes a housing, a guide member, and a pump, wherein the housing covers the memory controller and includes first and second inlets, an outlet, and first and second covers, wherein the cooling material is introduced through the first and second inlets, wherein the cooling material is discharged from the outlet, wherein first and second covers are configured to open and close the first and second inlets, respectively, wherein the guide member is attached to the housing and is configured to guide the flow of the cooling material toward the outlet, and wherein the pump is configured to adjust an amount of the cooling material, and wherein the flow of the cooling material around the memory controller is spirally guided by the guide member, and a number of times in which the cooling material comes into contact with the guide member is adjusted by controlling the pump.

BRIEF DESCRIPTION OF THE DRAWINGS

The above and features of the present inventive concept will become more apparent by describing in detail exemplary embodiments thereof with reference to the attached drawings, in which.

DETAILED DESCRIPTION OF THE EMBODIMENTS

Hereinafter, exemplary embodiments of the present inventive concept will be described with reference to the accompanying drawings.

Figure 1:
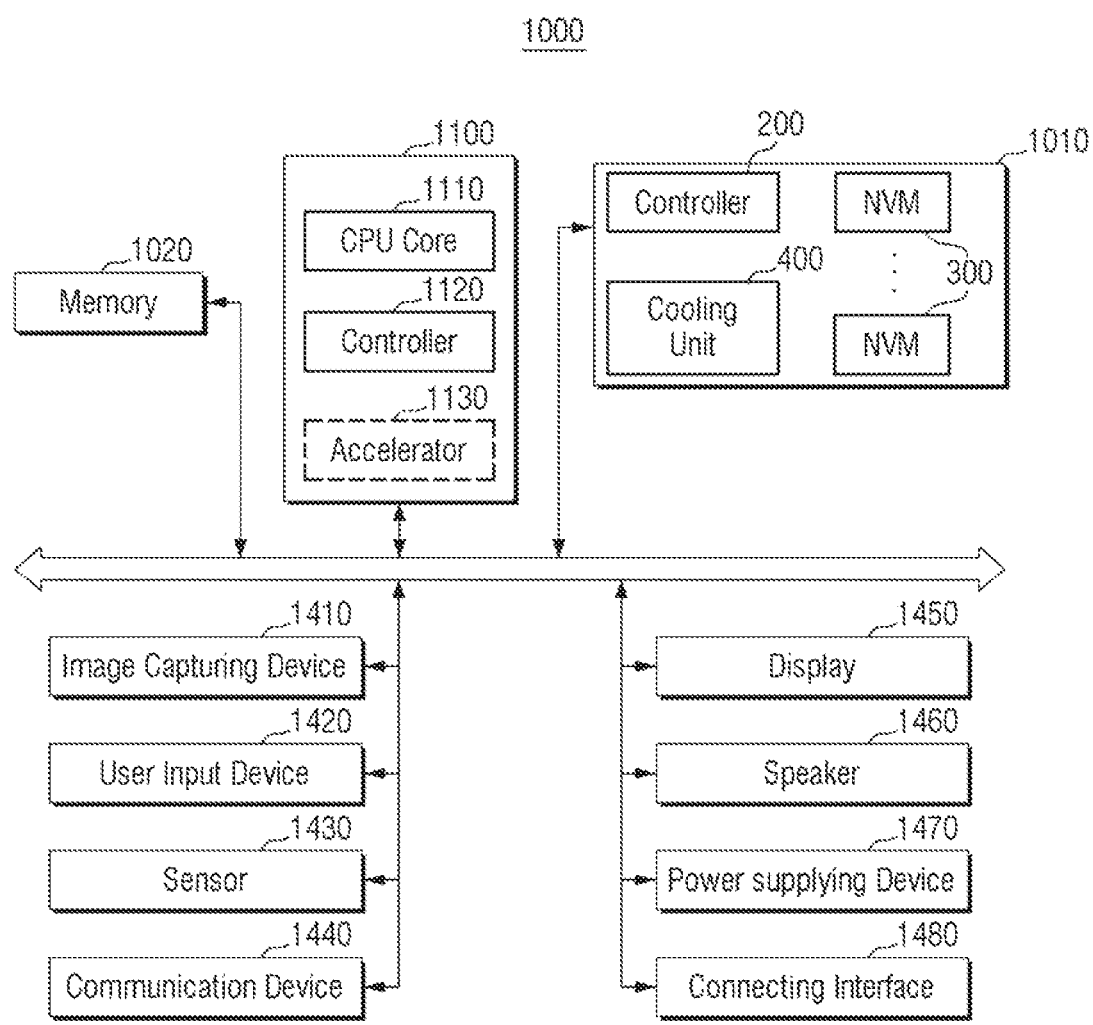
FIG. 1 is a block diagram illustrating a system to which a storage system according to an exemplary embodiment of the present inventive concept is applied.

FIG. 1 is a block diagram illustrating a system to which a storage system according to an exemplary embodiment of the present inventive concept is applied.

Referring to FIG. 1, a system 1000 in FIG. 1 may be, for example, a mobile system such as an automotive computer, a portable communication terminal (e.g., a mobile phone), a smart phone, a tablet personal computer (tablet PC), a wearable device, a health care device, or an Internet of things (IOT) device. However, the system 1000 in FIG. 1 is not limited to the mobile system, and may be, a personal computer, a laptop computer, a server, an automotive device such as a media player or a navigation system, an autonomous driving system, or the like.

Referring to FIG. 1, the system 1000 may include a main processor 1100, a memory 1020, and a storage device 1010, and may further include one or more among an image capturing device 1410, a user input device 1420, a sensor 1430, a communication device 1440, a display 1450, a speaker 1460, a power supplying device 1470, and a connecting interface 1480.

The main processor 1100 may control the overall operation of the system 1000. For example, the main processor 1100 may control the operations of other components constituting the system 1000. The main processor 1100 may be implemented as a general-purpose processor, a dedicated processor, an application processor, or the like.

The main processor 1100 may include one or more CPU cores 1110, and may further include a controller 1120 for controlling the memory 1020 and/or the storage device 1010. According to an exemplary embodiment of the present inventive concept, the main processor 1100 may further include an accelerator block 1130 which is a dedicated circuit for high-speed data operation such as artificial intelligence (AI) data operation. The accelerator block 1130 may include, for example, a graphics processing unit (GPU), a neural processing unit (NPU), and/or a data processing unit (DPU), and may be implemented as a separate chip physically independent of other components of the main processor 1100.

The memory 1020 may be used as a main memory of the system 1000 and may include a volatile memory such as an SRAM and/or a DRAM, but may also include a non-volatile memory such as a flash memory, a PRAM and/or an RRAM. The memory 1020 may be implemented in the same package as the main processor 1100. The memory 1020 is shown in the singular form in the drawings, but the present inventive concept is not limited thereto and there may be a plurality of memories according to an exemplary embodiment of the present inventive concept.

The storage device 1010 may function as a non-volatile storage device that stores data regardless of whether power is supplied, and may have a relatively larger storage capacity than the memory 1020. The storage device 1010 is shown in the singular form in the drawings, but the present inventive concept is not limited thereto and there may be a plurality of storage devices according to an exemplary embodiment of the present inventive concept.

The storage device 1010 includes a memory controller 200, a cooling unit 400, which provides a cooling material L to the memory controller 200, and a non-volatile memory (NVM) device 300 which stores data under control of the memory controller 200.

The cooling unit 400 may include a control unit which senses whether the atmospheric pressure in the storage device 1010 is reduced and controls a flow of the cooling material according to the sensed atmospheric pressure. When an air pressure reduction is sensed by the control unit, the cooling material L may be provided to the memory controller 200 by a pump 430.

The non-volatile memory device 300 may include a V-NAND flash memory having a two-dimensional (2D) structure or a three-dimensional (3D) structure, but the non-volatile memory device 300 is not limited thereto and may include other types of non-volatile memories such as a PRAM and/or an RRAM.

The storage device 1010 may be included in the system 1000 in a state of being physically separated from the main processor 1100, or may be included in the system 1000 in a form of being mounted on a printed circuit board (PCB) 101. In addition, the storage device 1010 may be implemented in the same package as the main processor 1100 or have a form such as a memory card, and thus, may also be detachably coupled to other components of the system 1000 through an interface such as the connecting interface 1480 to be described later. The storage device 1010 may be a device to which a standard protocol such as universal flash storage (UFS) is applied, but the present inventive concept is not limited thereto.

The image capturing device 1410 may capture a still image or a moving image, and may be, for example, a camera, a camcorder, and/or a webcam.

The user input device 1420 may receive various types of data input from a user of the system 1000, and may be, for example, a touch pad, a keypad, a keyboard, a mouse, and/or a microphone.

The sensor 1430 may sense various types of physical quantities which may be acquired or received from the outside of the system 1000, and may convert the sensed physical quantities into electrical signals. For example, the sensor 1430 may be a temperature sensor, a pressure sensor, an illuminance sensor, a position sensor, an acceleration sensor, a biosensor, and/or a gyroscope.

The communication device 1440 may transmit signals to and receive signals from other devices outside the system 1000 according to various communication protocols. The communication device 1440 may be implemented by including an antenna, a transceiver, and/or a modem.

The display 1450 and the speaker 1460 may function as output devices which respectively output visual information and audio information to the user of the system 1000.

The power supplying device 1470 may appropriately convert power supplied from a battery built in the system 1000 and/or an external power source to supply the power to each component of the system 1000.

The connecting interface 1480 may provide a connection between the system 1000 and an external device that is connected to the system 1000 and may exchange data with the system 1000. The connecting interface 1480 may be implemented using various interface schemes such as advanced technology attachment (ATA), serial ATA (SATA), external SATA (e-SATA), a small computer small interface (SCSI), a serial attached SCSI (SAS), a peripheral component interconnection (PCI), a PCI express (PCIe), an NVM express (NVMe), IEEE 1394, a universal serial bus (USB), a secure digital (SD) card, a multi-media card (MMC), an embedded multi-media card (eMMC), a universal flash storage (UFS), an embedded universal flash storage (eUFS), a compact flash (CF) card interface, and the like.

Figure 2:
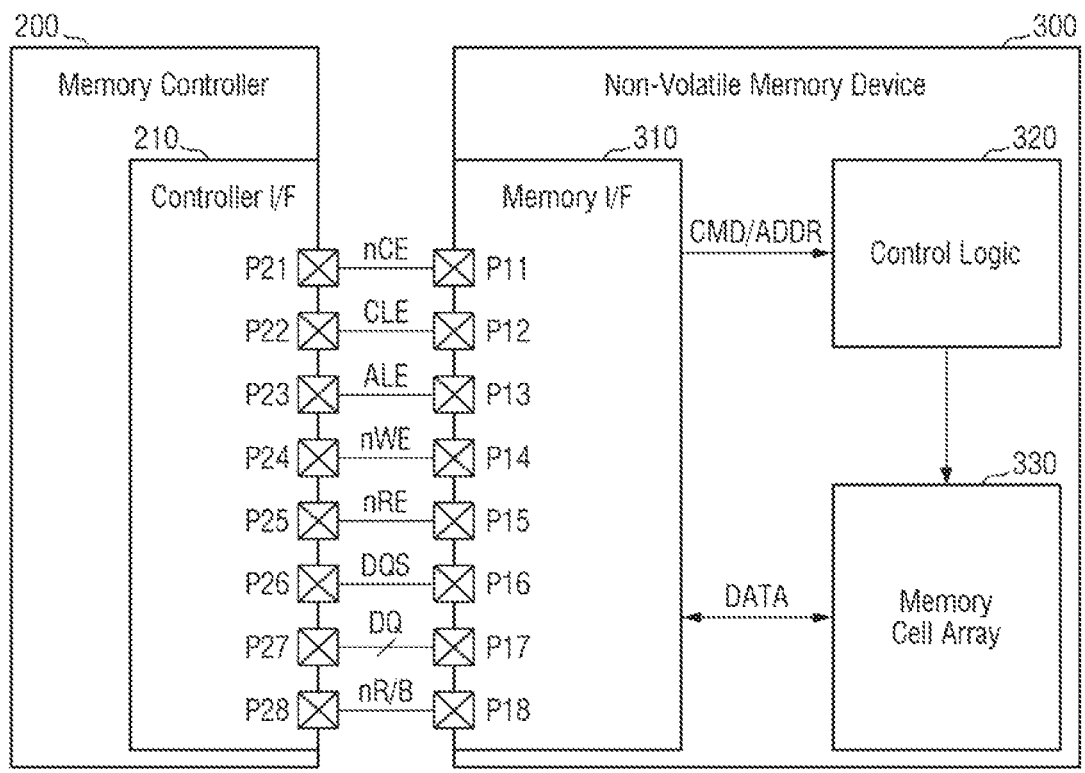
FIG. 2 is a block diagram illustrating a storage system according to an exemplary embodiment of the present inventive concept.

FIG. 2 is a block diagram illustrating a storage system according to an exemplary embodiment of the present inventive concept. A storage system 10 may correspond to the storage device 1010 in FIG. 1.

Referring to FIG. 2, the storage system 10 may include a memory controller 200 and a non-volatile memory device 300. The memory controller 200 and the non-volatile memory device 300 may respectively correspond to the memory controller 200 and the non-volatile memory device 300 in FIG. 1.

The non-volatile memory device 300 may include first to eighth pins P11 to P18, a memory interface circuit 310, a control logic circuit 320, and a memory cell array 330.

The memory interface circuit 310 may receive a chip enable signal nCE from the memory controller 200 through the first pin P11. The memory interface circuit 310 may transmit signals to and receive signals from the memory controller 200 through the second to eighth pins P12 to P18 according to the chip enable signal nCE. For example, when the chip enable signal nCE is in an enable state (for example, at a low voltage level), the memory interface circuit 310 may transmit signals to and receive signals from the memory controller 200 through the second to eighth pins P12 to P18.

The memory interface circuit 310 may receive a command latch enable signal CLE, an address latch enable signal ALE, and a write enable signal nWE from the memory controller 200 through the second to fourth pins P12 to P14. The memory interface circuit 310 may receive a data signal DQ from the memory controller 200 through the seventh pin P17 or may transmit the data signal DQ to the memory controller 200. A command CMD, an address ADDR, and data DATA may be transmitted through the data signal DQ. For example, the data signal DQ may be transmitted through a plurality of data signal lines. In this case, the seventh pin P17 may include a plurality of pins corresponding to a plurality of data signals.

The memory interface circuit 310 acquire the command CMD from the data signal DQ received in an enable period (for example, a high level state) of the command latch enable signal CLE based on toggle timings of the write enable signal nWE. The memory interface circuit 310 may acquire the address ADDR from the data signal DQ received in an enable period (for example, a high level state) of the address latch enable signal ALE based on the toggle timings of the write enable signal nWE.

In an exemplary embodiment of the present inventive concept, the write enable signal nWE may be toggled between a high level and a low level while maintaining a static state (for example, a high level or low level). For example, the write enable signal nWE may be toggled in a period in which the command CMD or the address ADDR is transmitted. Accordingly, the memory interface circuit 310 may acquire the command CMD or the address ADDR based on the toggle timings of the write enable signal nWE.

The memory interface circuit 310 may receive a read enable signal nRE from the memory controller 200 through the fifth pin P15. The memory interface circuit 310 may receive a data strobe signal DQS from the memory controller 200 through the sixth pin P16 or transmit the data strobe signal DQS to the memory controller 200 through the sixth pin P16.

In an operation of outputting the data DATA of the non-volatile memory device 300, the memory interface circuit 310 may receive the read enable signal nRE toggled through the fifth pin P15 before outputting the data DATA. The memory interface circuit 310 may generate the data strobe signal DQS toggled based on the toggling of the read enable signal nRE. For example, the memory interface circuit 310 may generate the data strobe signal DQS which starts toggling after a predetermined delay based on a toggling start time of the read enable signal nRE. The memory interface circuit 310 may transmit the data signal DQ, which includes the data DATA, based on the toggle timing of the data strobe signal DQS. Accordingly, the data DATA may be aligned with the toggle timing of the data strobe signal DQS and may be transmitted to the memory controller 200.

In the operation of inputting the data DATA of the non-volatile memory device 300, when the data signal DQ including the data DATA is received from the memory controller 200, the memory interface circuit 310 may receive the data strobe signal DQS toggled together with the data DATA from the memory controller 200. The memory interface circuit 310 may acquire the data DATA from the data signal DQ based on the toggle timing of the data strobe signal DQS. For example, the memory interface circuit 310 may acquire the data DATA by sampling the data signal DQ at a rising edge and a falling edge of the data strobe signal DQS.

The memory interface circuit 310 may transmit a ready/busy output signal nR/B to the memory controller 200 through the eighth pin P18. The memory interface circuit 310 may transmit state information of the non-volatile memory device 300 to the memory controller 200 through the ready/busy output signal nR/B. When the non-volatile memory device 300 is in a busy state (for example, when internal operations of the non-volatile memory device 300 are being performed), the memory interface circuit 310 may transmit the ready/busy output signal nR/B, which indicates a busy state, to the memory controller 200. When the non-volatile memory device 300 is in a ready state (for example, when the internal operations of the non-volatile memory device 300 are not performed or are completed), the memory interface circuit 310 may transmit the ready/busy output signal nR/B, which indicates a ready state, to the memory controller 200. For example, while the non-volatile memory device 300 reads data DATA from the memory cell array 330 in response to a page read command, the memory interface circuit 310 may transmit the ready/busy output signal nR/B, which indicates a busy state, (for example, a low level) to the memory controller 200. For example, while the non-volatile memory device 300 programs the data DATA in the memory cell array 330 in response to a program command, the memory interface circuit 310 may transmit the ready/busy output signal nR/B, which indicates the busy state, to the memory controller 200.

The control logic circuit 320 may control various operations of the non-volatile memory device 300. The control logic circuit 320 may receive a command/address CMD/ADDR acquired from the memory interface circuit 310. The control logic circuit 320 may generate control signals for controlling other components of the non-volatile memory device 300 according to the received command/address CMD/ADDR. For example, the control logic circuit 320 may generate various control signals for programming the data DATA in the memory cell array 330 or for reading the data DATA from the memory cell array 330.

The memory cell array 330 may store the data DATA acquired from the memory interface circuit 310 under control of the control logic circuit 320. The memory cell array 330 may output the stored data DATA to the memory interface circuit 310 under the control of the control logic circuit 320.

The memory cell array 330 may include a plurality of memory cells. For example, the plurality of memory cells may be flash memory cells. However, the present inventive concept is not limited thereto, and the memory cells may be, for example, resistive random access memory (RRAM) cells, ferroelectric random access memory (FRAM) cells, phase change random access memory (PRAM) cells, thyristor random access memory (TRAM) cells, and magnetic random access memory (MRAM) cells. Hereinafter, exemplary embodiments of the present inventive concept may be described with focus on the exemplary embodiment in which the memory cells are, for example, NAND flash memory cells.

The memory controller 200 may include first to eighth pins P21 to P28 and a controller interface circuit 210. The first to eighth pins P21 to P28 may respectively correspond to the first to eighth pins P11 to P18 of the non-volatile memory device 300.

The controller interface circuit 210 may transmit the chip enable signal nCE to the non-volatile memory device 300 through the first pin P21. The controller interface circuit 210 may transmit signals to and receive signals from the non-volatile memory device 300 selected through the chip enable signal nCE through the second to eighth pins P22 to P28.

The controller interface circuit 210 may transmit the command latch enable signal CLE, the address latch enable signal ALE, and the write enable signal nWE to the non-volatile memory device 300 through the second to fourth pins P22 to P24. The controller interface circuit 210 may transmit the data signal DQ to the non-volatile memory device 300 or receive the data signal DQ from the non-volatile memory device 300 through the seventh pin P27.

The controller interface circuit 210 may transmit the data signal DQ, which includes the command CMD or the address ADDR, to the non-volatile memory device 300 with the toggling write enable signal nWE. The controller interface circuit 210 may transmit the data signal DQ including the command CMD to the non-volatile memory device 300 as the command latch enable signal CLE having an enable state, and may transmit the data signal DQ including the address ADDR to the non-volatile memory device 300 as the address latch enable signal ALE having the enable state.

The controller interface circuit 210 may transmit the read enable signal nRE to the non-volatile memory device 300 through the fifth pin P25. The controller interface circuit 210 may receive the data strobe signal DQS from the non-volatile memory device 300 through the sixth pin P26 or transmit the data strobe signal DQS to the non-volatile memory device 300.

In the operation of outputting the data DATA of the non-volatile memory device 300, the controller interface circuit 210 may generate the toggling read enable signal nRE and transmit the read enable signal nRE to the non-volatile memory device 300. For example, the controller interface circuit 210 may generate the read enable signal nRE, which is changed from a static state (for example, a high level or low level) to a toggled state before the data DATA is output. Accordingly, in the non-volatile memory device 300, the data strobe signal DQS, which is toggled based on the read enable signal nRE, may be generated. The controller interface circuit 210 may receive the data signal DQ, which includes the data DATA, with the data strobe signal DQS toggled from the non-volatile memory device 300. The controller interface circuit 210 may acquire the data DATA from the data signal DQ based on the toggle timing of the data strobe signal DQS.

In the operation of inputting the data DATA of the non-volatile memory device 300, the controller interface circuit 210 may generate a toggling data strobe signal DQS. For example, the controller interface circuit 210 may generate the data strobe signal DQS, which is changed from a static state (for example, a high level or low level) to a toggled state, before the data DATA is transmitted. The controller interface circuit 210 may transmit the data signal DQ, which includes the data DATA, to the non-volatile memory device 300 based on the toggle timings of the data strobe signal DQS.

The controller interface circuit 210 may receive the ready/busy output signal nR/B from the non-volatile memory device 300 through the eighth pin P28. The controller interface circuit 210 may determine the state information of the non-volatile memory device 300 based on the ready/busy output signal nR/B.

Figure 3:
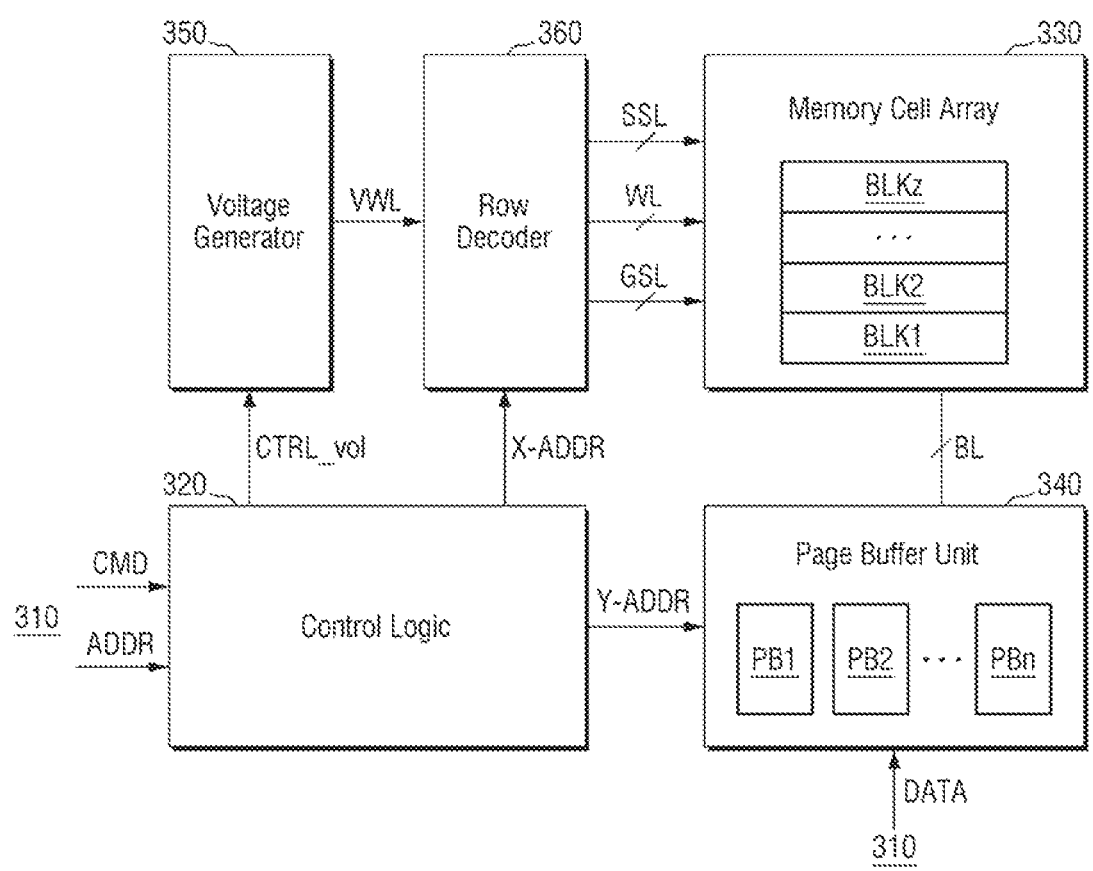
FIG. 3 is block diagram illustrating the non-volatile memory device in FIG. 2.

FIG. 3 is a block diagram illustrating the non-volatile memory device in FIG. 2.

Referring to FIG. 3, the non-volatile memory device 300 may include the control logic circuit 320, the memory cell array 330, a page buffer unit 340, a voltage generator 350, and a row decoder 360. The non-volatile memory device 300 may further include the memory interface circuit 310 shown in FIG. 2, and may further include a column logic, a pre-decoder, a temperature sensor, a command decoder, an address decoder, and the like.

The control logic circuit 320 may control various operations in the non-volatile memory device 300. The control logic circuit 320 may output various control signals in response to the command CMD and/or the address ADDR from the memory interface circuit 310. For example, the control logic circuit 320 may output a voltage control signal CTRL_vol, a row address X-ADDR, and a column address Y-ADDR.

The memory cell array 330 may include a plurality of memory blocks BLK1 to BLKz (z is a positive integer), and each of the plurality of memory blocks BLK1 to BLKz may include a plurality of memory cells. The memory cell array 330 may be connected to the page buffer unit 340 through bit lines BL, and may be connected to the row decoder 360 through word lines WL, string selection lines SSL, and ground selection lines GSL.

In an exemplary embodiment of the present inventive concept, the memory cell array 330 may include a three-dimensional memory cell array, and the three-dimensional memory cell array may include a plurality of NAND strings. Each NAND string may include memory cells respectively connected to the word lines vertically stacked on each other on a substrate.

In an exemplary embodiment of the present inventive concept, the memory cell array 330 may include a two-dimensional memory cell array, and the two-dimensional memory cell array may include a plurality of NAND strings arranged along row and column directions.

The page buffer unit 340 may include a plurality of page buffers PB1 to PBn (n is an integer greater than or equal to 3), and the plurality of page buffers PB1 to PBn may be respectively connected to the memory cells through the plurality of bit lines BL. The page buffer unit 340 may select at least one bit line among the bit lines BL in response to the column address Y-ADDR. The page buffer unit 340 may operate, for example, as a write driver or a sense amplifier according to an operation mode. For example, during a program operation, the page buffer unit 340 may apply a bit line voltage corresponding to data to be programmed to a selected bit line. During a read operation, the page buffer unit 340 may sense the data stored in the memory cell of the memory cell array 330 by sensing a current or voltage of the selected bit line.

The voltage generator 350 may generate various types of voltages for performing a programming operation, a read operation, and an erase operation based on the voltage control signal CTRL_vol. For example, the voltage generator 350 may generate a programming voltage, a read voltage, a program verification voltage, an erase voltage, and the like as a word line voltage VWL.

The row decoder 360 may select one of a plurality of word lines WL in response to the row address X-ADDR and may select one of a plurality of string selection lines SSL. For example, the row decoder 360 may apply the programming voltage and the program verification voltage to a selected word line during the programming operation. In addition, the row decoder 360 may receive the read enable signal nRe during the read operation, and may provide the data signal DQ and the data strobe signal DQS signal to the memory interface circuit 310 by applying the read voltage to the selected word line.

Figure 4:
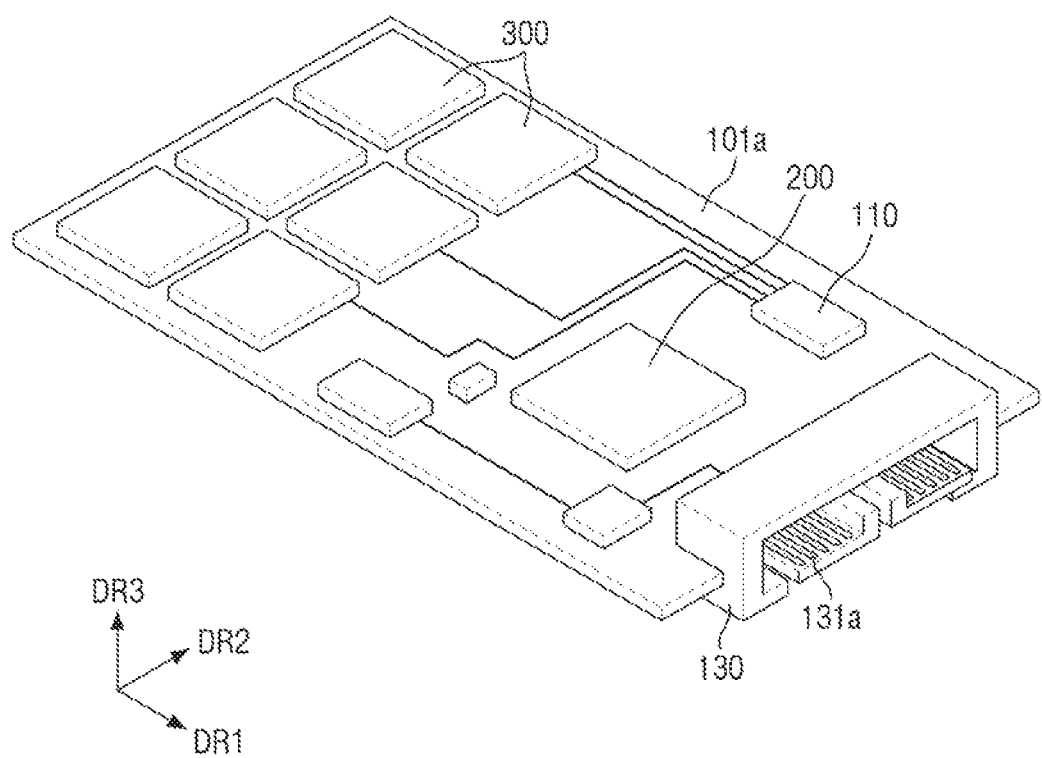
FIG. 4 is a perspective view schematically illustrating the storage device according to an exemplary embodiment of the present inventive concept.
Figure 5:
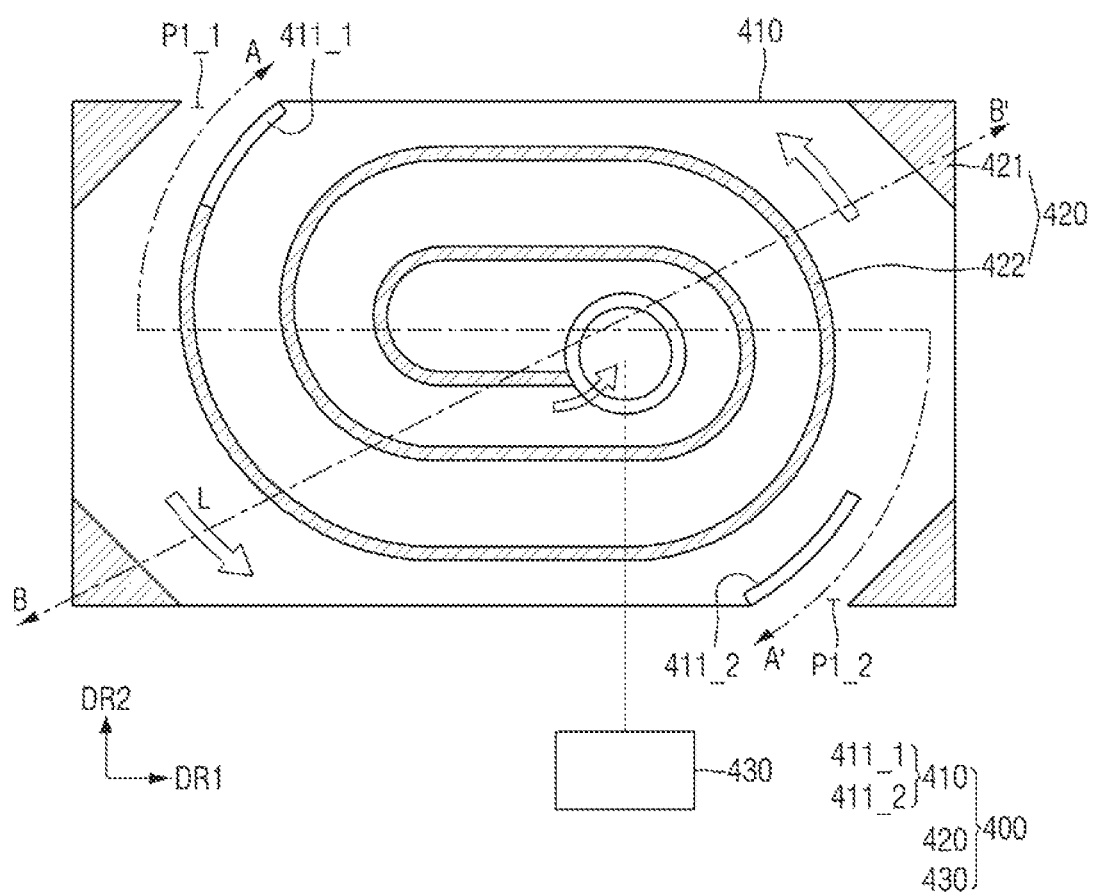
FIG. 5 is a view of the storage device from above according to an exemplary embodiment of the present inventive concept.
Figure 6:
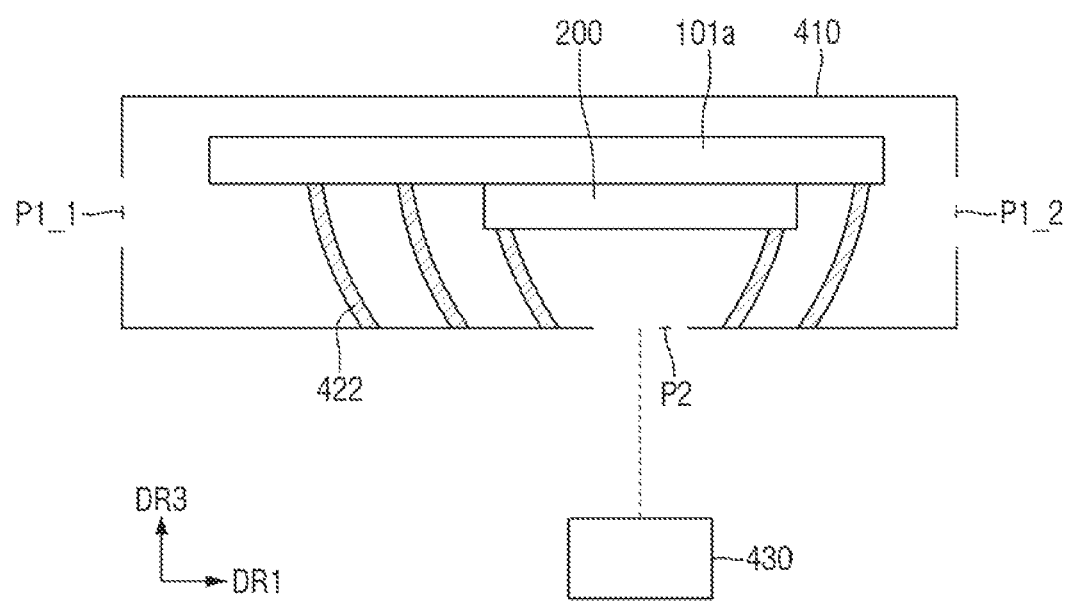
FIG. 6 is a cross-sectional view taken along line A-A' in FIG. 5.
Figure 7:
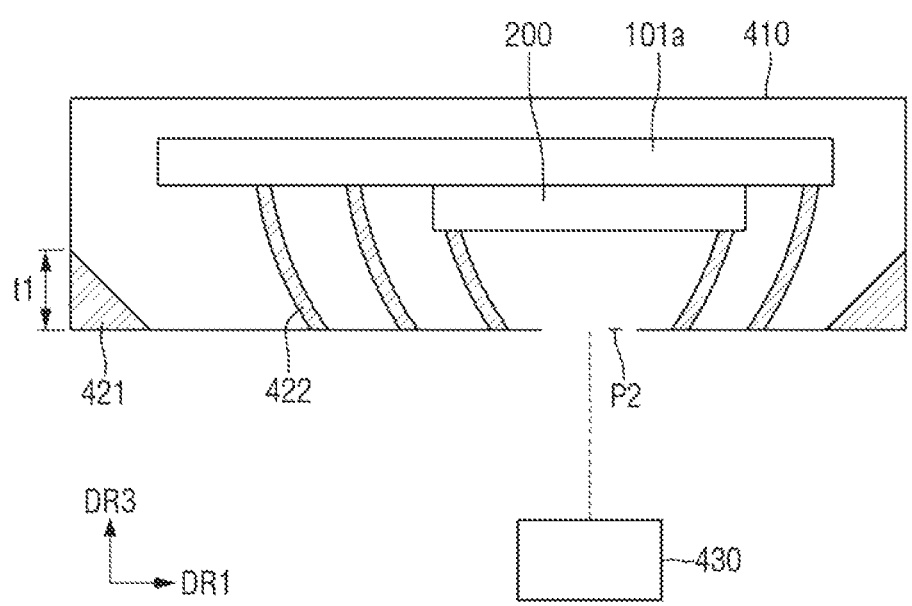
FIG. 7 is a cross-sectional view taken along line B-B' in FIG. 5.

FIG. 4 is a perspective view schematically illustrating the storage device according to an exemplary embodiment of the present inventive concept. FIG. 5 is a view of the storage device from above according to an exemplary embodiment of the present inventive concept. FIG. 6 is a cross-sectional view taken along line A-A' in FIG. 5. FIG. 7 is a cross-sectional view taken along line B-B' in FIG. 5.

Referring to FIGS. 1 and 4, the storage device 1010 may include a PCB board 101*a* and a volatile memory device 110 mounted on the PCB board 101*a*. The storage device 1010 may further include the memory controller 200 and the non-volatile memory device 300. For convenience of description, the cooling unit 400 is omitted in FIG. 4, and may be described together with reference to FIG. 5, which is to be described later.

The PCB board 101*a* may be, for example, a rigid printed circuit board (RPCB) or a flexible printed circuit board (FPCB). The PCB board 101*a* may receive power from an external power source, and may input and output data with an external host to receive an electrical signal from the outside. In addition, the PCB board 101*a* may provide the electrical signal to the memory controller 200.

The PCB board 101*a* may include a connector 130. The connector 130 may provide an electrical signal, which is provided from a device outside of the PCB board 101*a*, to other components included on the PCB board 101*a*. The connector 130 may include a plurality of pins 131*a* protruding in a first direction DR1.

The volatile memory device 110 may be, for example, a dynamic random access memory (DRAM) device. The volatile memory device 110 may serve as a buffer in a data exchange between the non-volatile memory device 300 and the memory controller 200.

The memory controller 200 may be mounted on the PCB board 101*a* and may receive an external electrical signal or power input through the connector 130.

A plurality of non-volatile memory devices 300 may be disposed on the PCB board 101*a*, and may be arranged along the first direction DR1 and a second direction DR2 that crosses the first direction DR1. In addition, the plurality of non-volatile memory devices 300 may write or read data according to a request of the memory controller 200.

Referring to FIG. 5, the storage device 1010 may further include a cooling unit 400. The cooling unit 400 may include a housing 410, a guide member 420, and a pump 430.

The housing 410 may be disposed to cover the memory controller 200. For example, the housing 410 may at least partially surround the memory controller 200. The housing 410 may include an insulating material such as a resin or the like. However, the present inventive concept is not limited thereto.

Referring to FIGS. 5 and 6, the housing 410 may include first_1 and first_2 points P1_1 and P1_2 disposed at first and second sides, respectively, of the housing 410. The housing 410 may further include a second point P2 disposed on a side of the housing 410 that connects the first and second sides to each other. For example, the side, in which the second point P2 is provided, may be disposed under the first and second sides of the housing 410. In an exemplary embodiment of the present inventive concept, the first and second sides may refer to two sides of the housing 410 facing each other. Further, in an exemplary embodiment of the present inventive concept, lower portions of the first and second sides may refer to lower surfaces of the housing 410 which connect the first and second sides to the PCB board 101*a*.

Inlets through which the cooling material L for cooling the memory controller 200 is introduced may be respectively disposed at the first_1 and first_2 points P1_1 and P1_2. For example, the outlet from which the cooling material L is discharged to the outside may be disposed at the second point P2. In this case, the second point P2 may be disposed to correspond to the memory controller 200 in a third direction DR3, which crosses the first direction DR1. For example, the second point P2 may overlap the memory controller 200 in the third direction DR3.

A first opening and closing cover 411_1 may be disposed at the first side of the housing 410 to control the inflow of the cooling material L. A second opening and closing cover 411_2 may be disposed at the second side of the housing 410 and may correspond to the first opening and closing cover 411_1 in a diagonal direction. For example, the first opening and closing cover 411_1 may diagonally face the second opening and closing cover 411_2.

The first and second opening and closing covers (e.g., first and second covers) 411_1 and 411_2 may each include, for example, an elastic member. For example, the elastic member may be a spring. However, the present inventive concept is not limited thereto.

The first_1 and first_2 points (e.g., first and second openings) P1_1 and P1_2 may be closed by the first and second opening and closing covers 411_1 and 411_2.

In an operating state of the pump 430 to be described later, when a pressure due to the cooling material L is applied to the first and second opening and closing covers 411_1 and 411_2, the first_1 and first_2 points P1_1 and P1_2 may be opened. In this case, when the pressure due to the cooling material L becomes greater than elastic forces of the elastic members of the first and second opening and closing covers 411_1 and 411_2, the first_1 and first_2 points P1_1 and P1_2 may be opened.

As the operation of the pump 430 is repeated, the number of times in which the memory controller 200 is cooled by the cooling material L may be adjusted. Further, as the operation of the pump 430 is repeated, the number of times in which the cooling material L comes into contact with the guide member 420 to be described later may be adjusted.

The guide member 420 may be attached to a lower portion of the housing 410 and may guide a flow of the cooling material L from the first_1 and first_2 points P1_1 and P1_2 toward the second point P2.

The guide member 420 may include a corner portion 421 and a partition wall 422. The corner portion 421 may disposed in a corner region of the housing 410, and the partition wall 422 may be disposed to spirally extend inside the corner portion 421. For example, the partition wall 422 may be curved to form a spiral shape.

Referring to FIG. 7, a height t1 of the guide member 420 may decrease as the second point P2 is approached. For example, since a height t1 of the corner portion 421 decreases toward the second point P2, the flow and discharge of the cooling material L may be facilitated.

Referring to FIGS. 5 to 7, the partition wall 422 may include a curved portion. For example, the partition wall 422 may be formed in a streamlined shape to effectively cool the memory controller 200 by facilitating the flow of the cooling material L.

Each of the corner portion 421 and the partition wall 422 may include an elastic material. For example, the elastic material may be silicone or rubber. However, the present inventive concept is not limited thereto.

When the guide member 420 includes an elastic material, the flow of the cooling material L to a region requiring relatively little cooling in the storage device 1010, for example, a region which is not adjacent to the storage controller 200, may be minimized. Accordingly, the cooling of the storage device 1010 may be more efficiently performed.

The cooling material L may be spirally guided and circulated toward the second point P2 by means of the corner portion 421 and the partition wall 422. Since the cooling material L may come into contact with the side surfaces of the corner portion 421 and the partition wall 422, the flow of the cooling material L may be spirally induced.

The cooling material L may be a refrigerant used for cooling the storage device 1010. For example, the cooling material L may be water or another liquid having a relatively low freezing point. However, the present inventive concept is not limited thereto.

The pump 430 may be disposed under the housing 410. The pump 430 may adjust an amount of the cooling material L flowing from the first_1 and first_2 points P1_1 and P1_2 to the second point P2. The number of times in which the cooling material L comes into contact with the guide member 420 may be adjusted by the pump 430.

The pump 430 may be, for example, a vacuum pump. In this case, in a second operating state of the above-described pump 430, an intensity of the pump 430 may be greater than in a first operating state. Accordingly, in the second operating state, the first and second opening and closing covers 411_1 and 411_2 may be opened, and thus, the cooling material L may be introduced into the first_1 and first_2 points P1_1 and P1_2. The type of the pump 430 may not be particularly limited as long as the pump 430 is used for cooling the storage device 1010.

Figure 8:
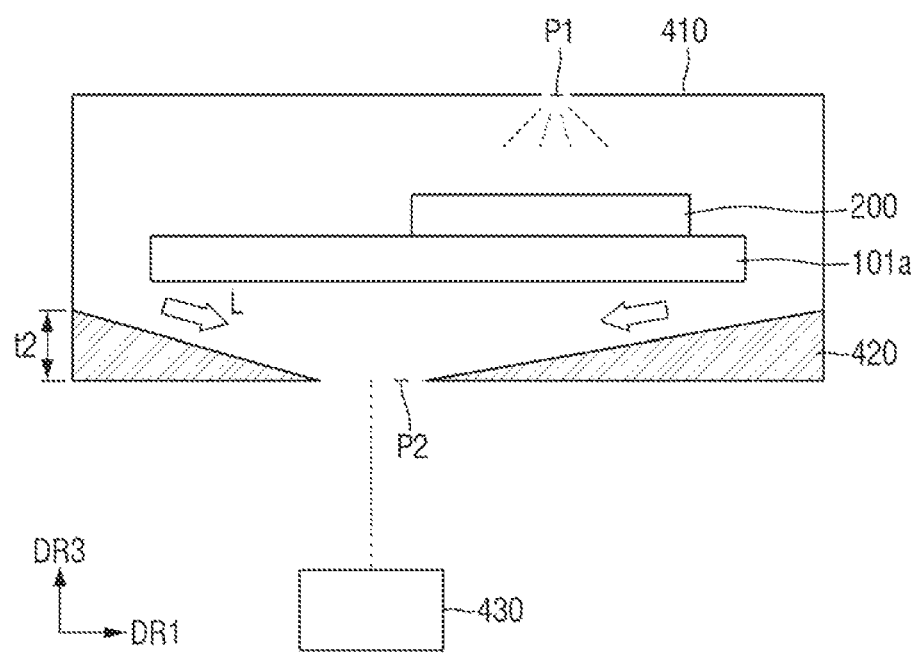
FIG. 8 is a view illustrating the storage device according to an exemplary embodiment of the present inventive concept.

FIG. 8 is a view illustrating the storage device according to an exemplary embodiment of the present inventive concept. For convenience of description, descriptions of the same or overlapping contents described with reference to FIGS. 1 to 7 may be omitted or simplified.

Referring to FIG. 8, the cooling unit 400 may include an inlet P1 through which the cooling material L is introduced from a third side of the housing 410 toward the memory controller 200. The inlet P1 may be a hole formed in the housing 410 to introduce the cooling material L into the storage device 1010.

In an exemplary embodiment of the present inventive concept, the third side may refer to an upper surface of the housing 410. In this case, the inlet P1, through which the cooling material L is introduced into the storage device 1010, is formed in the upper surface of the housing 410, and an outlet P2, from which the cooling material L is discharged to the outside, may be formed in a lower surface of the housing 410.

When the atmospheric pressure in the storage device 1010 is reduced by the first operation of the pump 430, the cooling material L may be introduced into the storage device 1010 from the inlet P1. Then, the cooling material L in the housing 410 may be discharged to the outside of the device through the second operation of the pump 430.

The guide member 420 may be disposed to guide the flow of the cooling material L in the vertical direction DR3 from the inlet P1 to the outlet P2. A height t2 of the guide member 420 may decrease as the outlet P2 is approached. For example, the guide member 420 may have a triangular shape, from a cross-sectional view. For example, since the height t2 of the corner portion 421 decreases toward the outlet P2, the flow and discharge of the cooling material L may be facilitated.

Figure 9:
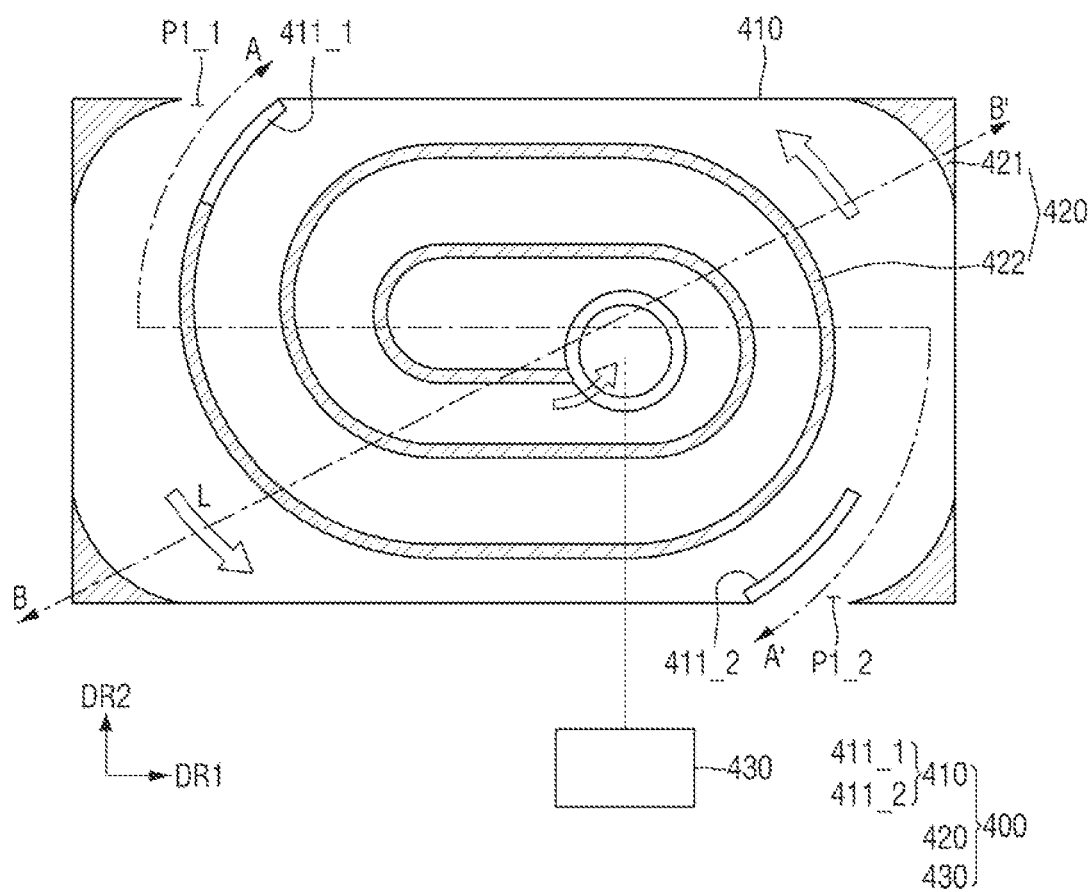
FIG. 9 is a view illustrating the storage device according to an exemplary embodiment of the present inventive concept, and is a view corresponding to FIG. 5.
Figure 10:
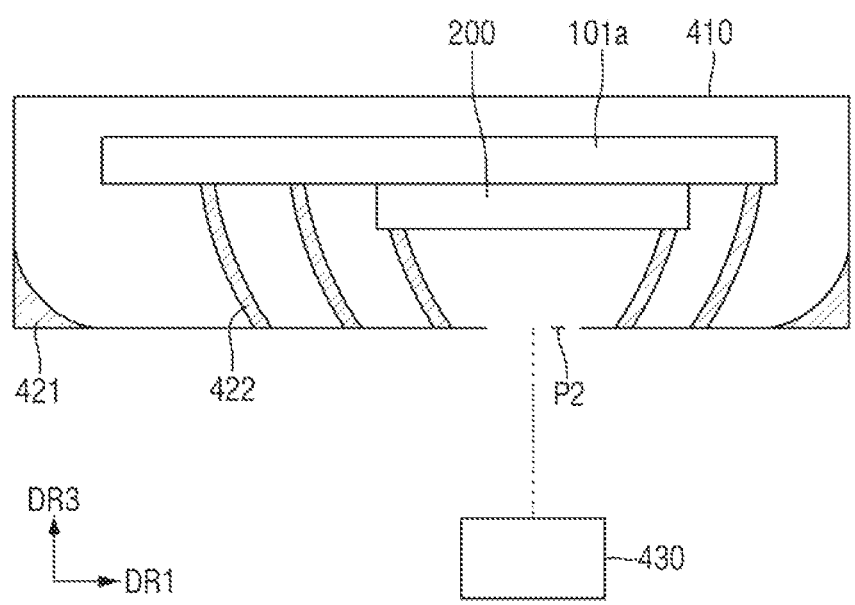
FIG. 10 is a view illustrating the storage device according to an exemplary embodiment of the present inventive concept, and is a view corresponding to FIG. 7.
Figure 11:
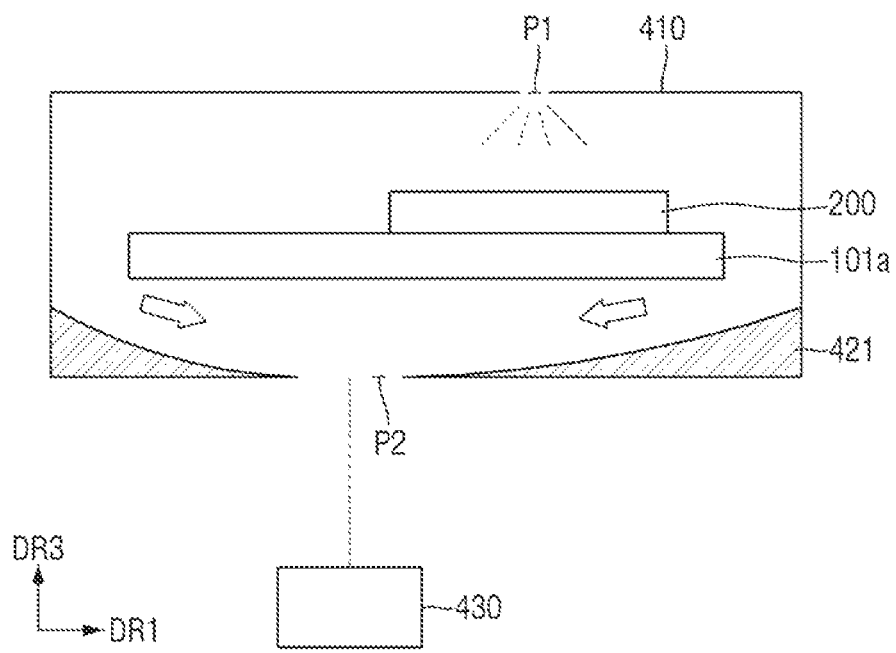
FIG. 11 is a view illustrating the storage device according to an exemplary embodiment of the present inventive concept, and is a view corresponding to FIG. 8.

FIG. 9 is a view illustrating the storage device according to an exemplary embodiment of the present inventive concept, and is a view corresponding to FIG. 5. FIG. 10 is a view illustrating the storage device according to an exemplary embodiment of the present inventive concept, and is a view corresponding to FIG. 7. FIG. 11 is a view illustrating the storage device according to an exemplary embodiment of the present inventive concept, and is a view corresponding to FIG. 8. For convenience of description, descriptions of the same or overlapping contents described with reference to FIGS. 1 to 8 may be omitted or simplified.

Referring to FIGS. 9 to 11, the corner portion 421 may include a curved portion. For example, the corner portion 421 may be formed in a streamlined shape to effectively perform the cooling of the memory controller 200 by facilitating the flow of the cooling material L.

Figure 12:
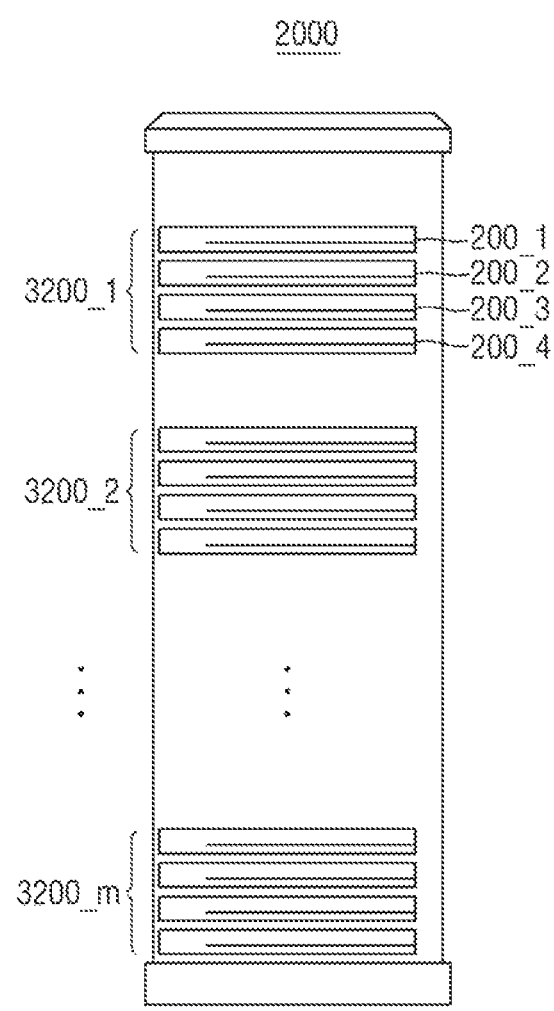
FIG. 12 is a view schematically illustrating a cooling system of the storage device according to an exemplary embodiment of the present inventive concept.

FIG. 12 is a view schematically illustrating a cooling system of the storage device according to an exemplary embodiment of the present inventive concept. For convenience of description, descriptions of the same or overlapping contents described with reference to FIGS. 1 to 11 may be omitted or simplified.

Referring to FIG. 12, a cooling device 2000 used in the cooling system of a storage device may include a plurality of servers 3200_1, 3200_2, . . . , 3200_m, each of which includes a plurality of memory controllers 200_1, 200_2, 200_3, and 200_4.

The storage device 1010 used in the cooling system of the storage device according to an exemplary embodiment of the present inventive concept may include the non-volatile memory device 300, the memory controller 200, and the cooling unit 400 described in FIGS. 1 to 11. One of the plurality of memory controllers 200_1, 200_2, 200_3, and 200_4 in FIG. 12 may correspond to the memory controller 200 described in FIGS. 1 to 11.

The cooling unit 400 may include the housing 410, the guide member 420, and the pump 430.

The housing 410 may cover the memory controller 200. The housing 410 may include first_1 and first_2 inlets P1_1 and P1_2, an outlet P2, the first and second opening and closing covers 411_1 and 411_2. The cooling material L is introduced through the first_1 and first_2 inlets P1_1 and P1_2, and the cooling material L may be discharged through the outlet P2. The first and second opening and closing covers 411_1 and 411_2 may open and close the first_1 and first_2 inlets P1_1 and P1_2.

The guide member 420 may be attached to the housing 410 and guide the flow of the cooling material L so that the flow of the cooling material L is directed toward the outlet P2.

Each of the corner portion 421 and the partition wall 422 may include an elastic material. For example, the elastic material may be silicone or rubber. However, the present inventive concept is not limited thereto.

When the guide member 420 includes an elastic material, the flow of the cooling material L to a region requiring relatively little cooling in the storage device 1010, for example, a region which is not adjacent to the storage controller 200, may be minimized. Accordingly, the cooling of the storage device 1010 may be more efficiently performed.

The cooling material L may flow toward the outlet P2 along the corner portion 421 and the partition wall 422. Accordingly, the flow of the cooling material L around the memory controller 200 may be spirally guided by the corner portion 421 and the partition wall 422.

The pump 430 may adjust the amount of the cooling material L by applying pressure to the inside of the storage device 1010.

The first_1 and 1_2 inlets P1_1 and P1_2 may be closed by the first and second opening and closing covers 411_1 and 411_2, respectively.

In the operating state of the pump 430, when the pressure due to the cooling material L is applied to the first and second opening and closing covers 411_1 and 411_2, the first_1 and first_2 points P1_1 and P1_2 may be opened. In this case, when the pressure due to the cooling material L becomes greater than the elastic forces of the elastic members of the first and second opening and closing covers 411_1 and 411_2, the first_1 and 1_2 inlets P1_1 and P1_2 may be opened.

The pump 430 may adjust the amount of the cooling material L flowing from the first_1 and 1_2 inlets P1_1 and P1_2 to the outlet P2.

According to an exemplary embodiment of the present inventive concept, the flow of the cooling material L may be smoothly induced by the guide member 420 in consideration of a position of the memory controller 200. Further, the number of times in which the cooling material L comes into contact with the guide member 420 may be adjusted by the pump 430.

Accordingly, when the storage device is cooled by an immersion in a refrigerant, the cooling of the storage device may be more efficiently performed. Further, even when a method of cooling heat generated in the storage device using a circulating liquid or a method of performing cooling using a vaporization phenomenon is used, the storage device may be more effectively cooled.

Figure 13:
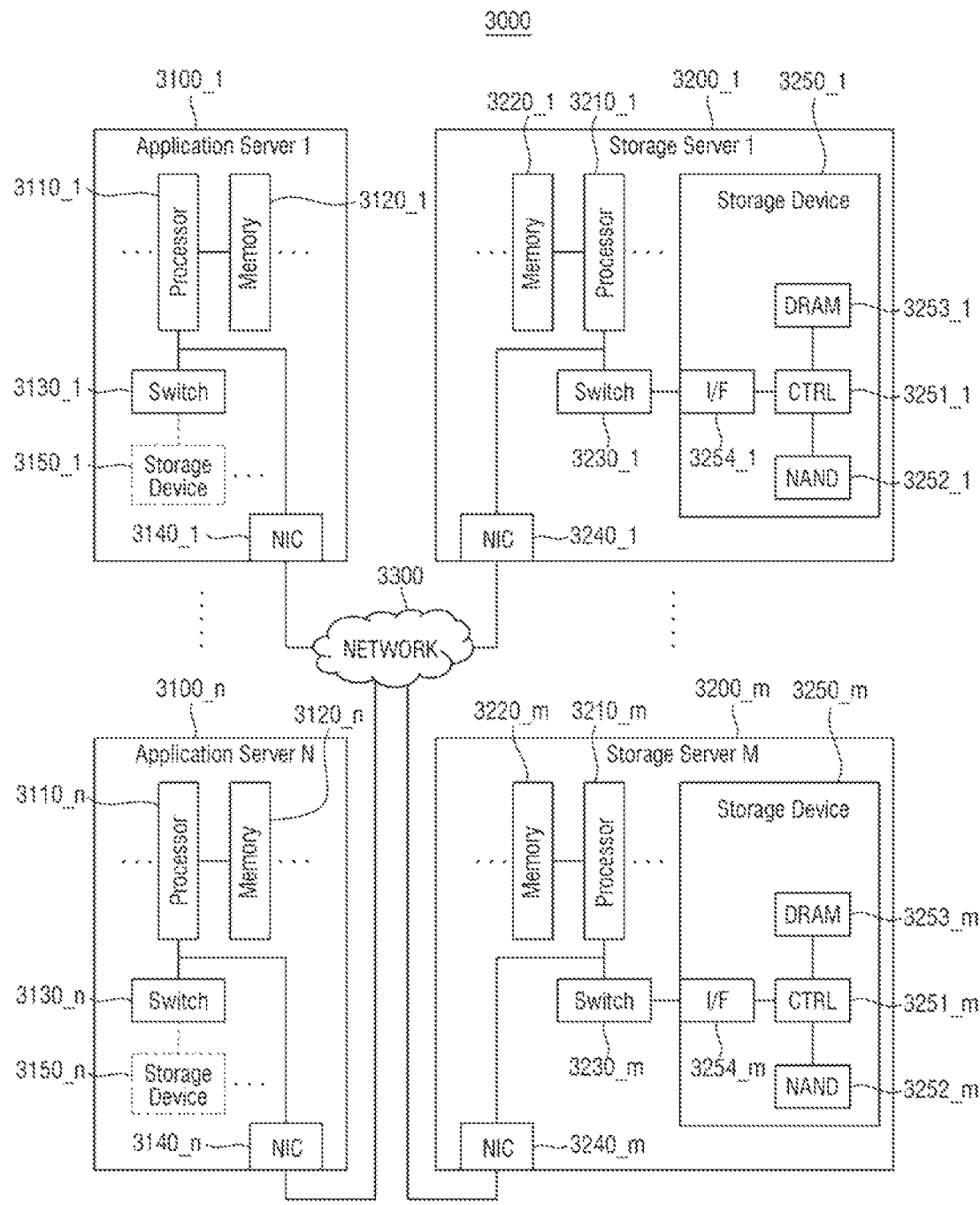
FIG. 13 is a view illustrating a data center to which the storage device according to an exemplary embodiment of the present inventive concept is applied.

FIG. 13 is a view for describing a data center to which the storage device according to an exemplary embodiment of the present inventive concept is applied.

Referring to FIG. 13, a data center 3000 is a facility which collects various types of data and provides services, and may also be referred to as a data storage center. For example, the data center 3000 may be a system for operating a search engine and a database, and may be a computing system used in a business such as a bank or a government institution. The data center 3000 may include application servers 3100_1 to 3100_n and storage servers 3200_1 to 3200_m. The number of application servers 3100_1 to 3100_n and the number of storage servers 3200_1 to 3200_m may be variously selected according to embodiments, and the number of application servers 3100_1 to 3100_n and the number of storage servers 3200_1 to 3200_m may be different from each other.

The application server 3100_1 or the storage server 3200_1 may include at least one of processors 3110 and 3210 and memories 3120 and 3220. When the storage server 3200 is described as an example, the processor 3210 may control the overall operation of the storage server 3200 and may access the memory 3220 to execute instructions and/or data loaded into the memory 3220. The memory 3220 may be, for example, a double data rate synchronous DRAM (DDR SDRAM), a high bandwidth memory (HBM), a hybrid memory cube (HMC), a dual in-line memory module (DIMM), an Optane DIMM, or a non-volatile DIMM (NVMDIMM). According to an exemplary embodiment of the present inventive concept, the number of processors 3210 and the number of memories 3220 included in the storage server 3200 may be variously selected.

In an exemplary embodiment of the present inventive concept, the processor 3210 and the memory 3220 may provide a processor-memory pair. In an exemplary embodiment of the present inventive concept, the number of processors 3210 and the number of memories 3220 may be different from each other. The processor 3210 may include a single-core processor or a multi-core processor. The above description of the storage server 3200 may be similarly applied to the application server 3100. According to an exemplary embodiment of the present inventive concept, the application server 3100 might not include a storage device 3150. The storage server 3200 may include at least one or more storage devices 3250. The number of storage devices 3250 included in the storage server 3200 may be variously selected according to an exemplary embodiment of the present inventive concept.

The application servers 3100_1 to 3100_n and the storage servers 3200_1 to 3200_m may communicate with each other through a network 3300. The network 3300 may be implemented using, for example, a Fibre Channel (FC) or an Ethernet. In this case, the FC is a medium used for relatively high-speed data transmission, and may use an optical switch providing high performance/high availability. The storage servers 3200_1 to 3200_m may be provided as a file storage, a block storage, or an object storage according to an access method of the network 3300.

In an exemplary embodiment of the present inventive concept, the network 3300 may be a storage-only network, such as a storage area network (SAN). For example, the SAN may be an FC-SAN using an FC network and implemented according to FC Protocol (FCP). As another example, the SAN may be an IP-SAN using a TCP/IP network and implemented according to an iSCSI (SCSI over TCP/IP or Internet SCSI) protocol. In an exemplary embodiment of the present inventive concept, the network 3300 may be a generic network, such as a TCP/IP network. For example, the network 3300 may be implemented according to protocols such as an FC over Ethernet (FCoE), a Network Attached Storage (NAS), an NVMe over Fabrics (NVMe-oF), and the like.

Hereinafter, the application server 3100 and the storage server 3200 will be mainly described. A description of the application server 3100 may be applied to other application servers 3100_n, and a description of the storage server 3200 may be applied to other storage servers 3200_m.

The application server 3100 may store data requested to be stored by a user or a client in one of the storage servers 3200_1 to 3200_m through the network 3300. Further, the application server 3100 may acquire data requested to be read by the user or the client from one of the storage servers 3200_1 to 3200_m through the network 3300. For example, the application server 3100 may be implemented as a web server or a database management system (DBMS).

The application server 3100 may access the memory 3120_n or the storage device 3150_n included in another application server 3100_n through the network 3300, or may access the storage servers 3200_1 to 3200_m or the storage devices 3250_1 to 3250_m included in the memories 3220_1 to 3220_m through the network 3300. Accordingly, the application server 3100 (e.g., 3100_1) may perform various operations on data stored in the application servers 3100_1 to 3100_n and/or the storage servers 3200_1 to 3200_m. For example, the application server 3100 may execute a command for moving or copying the data between the application servers 3100_1 to 3100_n and/or the storage servers 3200_1 to 3200_m. In this case, the data may be moved from the storage devices 3250_1 to 3250_m of the storage servers 3200_1 to 3200_m to the memories 3120_1 to 3120_n of the application servers 3100_1 to 3100_n through the memories 3220_1 to 3220_m of the storage servers 3200_1 to 3200_m, or the data may be moved directly moved to the memories 3120 to 3120_n of the application servers 3100 to 3100_n from the storage devices 3250_1 to 3250_m of the storage servers 3200_1 to 3200_m. The data moving through the network 3300 may be data encrypted for security or privacy.

In a description of the storage server 3200 as an example, an interface 3254 may provide a physical connection between the processor 3210 and a controller 3251, and may provide a physical connection between an NIC 3240 and the controller 3251. For example, the interface 3254 may be implemented using a direct attached storage (DAS) method of directly connecting the storage device 3250 with a dedicated cable. Further, for example, the interface 3254 may be implemented using various interface schemes such as advanced technology attachment (ATA), serial ATA (SATA), external SATA (e-SATA), a small computer small interface (SCSI), a serial attached SCSI (SAS), a peripheral component interconnection (PCI), a PCI express (PCIe), an NVM express (NVMe), IEEE 1394, a universal serial bus (USB), a secure digital (SD) card, a multi-media card (MMC), an embedded multi-media card (eMMC), a universal flash storage (UFS), an embedded universal flash storage (eUFS), a compact flash (CF) card interface, and the like.

The storage server 3200 may further include a switch 3230 and the NIC 3240. The switch 3230 may selectively connect the processor 3210 to the storage device 3250 or the NIC 3240 based on the control of the processor 3210.

In an exemplary embodiment of the present inventive concept, the NIC 3240 may include a network interface card, a network adapter, and the like. The NIC 3240 may be connected to the network 3300 by, for example, a wired interface, a wireless interface, a Bluetooth interface, an optical interface, or the like. The NIC 3240 may include, for example, an internal memory, a DSP, a host bus interface, and the like, and may be connected to the processor 3210 and/or the switch 3230 through the host bus interface. The host bus interface may be implemented using one of the examples of the above-described interface 3254. In an exemplary embodiment of the present inventive concept, the NIC 3240 may be integrated with at least one of the processor 3210, the switch 3230, and/or the storage device 3250.

In the storage servers 3200_1 to 3200_m or the application servers 3100_1 to 3100_n, the processor 3110_1 to 3110n and/or 3210_1 to 3210_m transmits a command to the storage devices 3150_1 to 3150_n and 3250_1 to 3250_m or the memories 3120_1 to 3120_n, and 3220_1 to 3220_m to program or read data. In this case, the data may be data error-corrected through an error correction code (ECC) engine. The data is data which is processed through data bus inversion (DBI) or data masking (DM), and the data may include cyclic redundancy code (CRC) information. The data may be data encrypted for security or privacy.

The storage devices 3150_1 to 3150_m and 3250_1 to 3250_m may transmit control signals and command/address signals to NAND flash memory devices 3252_1 to 3252_m in response to a read command received from the processor. Accordingly, when the data is read from the NAND flash memory devices 3252_1 to 3252_m, a read enable (RE) signal may be input as a data output control signal to output the data to a DQ bus. A data strobe DQS may be generated using the RE signal. The command and address signal may be latched in a page buffer according to a rising edge or a falling edge of a write enable (WE) signal.

The controller 3251 may control the overall operations of the storage device 3250. In an exemplary embodiment of the present inventive concept, the controller 3251 may include a static random access memory (SRAM). The controller 3251 may write data to the NAND flash 3252 in response to the write command, or may read data from the NAND flash 3252 in response to the read command. For example, the write command and/or the read command may be provided from the processor 3210 in the storage server 3200, the processor 3210_m in another storage server 3200_m, or the processors 3110 to 3110_n in the application servers 3100 to 3100_n. A DRAM 3253 may temporarily store (e.g., buffer) data written to the NAND flash 3252 or the data read from the NAND flash 3252. Further, the DRAM 3253 may store, for example, metadata. Here, the metadata is user data or data generated by the controller 3251 to manage the NAND flash 3252. The storage device 3250 may include a secure element (SE) for security or privacy.

In an exemplary embodiment of the present inventive concept, the storage devices 3150 and 3250 may perform the cooling of the memory controller 200 by including the above-described components with regard to the cooling of the memory controller 200. For example, the storage devices 3150 and 3250 may guide the flow of the cooling material L through the guide member 420 included in the storage devices 3150 and 3250. Further, the number of times in which the cooling material L comes into contact with the guide member 420 may be adjusted by controlling the operation of the pump 430.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A storage device comprising:
   a memory device;
   a memory controller; and
   a cooling unit configured to guide a flow of a cooling material to the memory controller,
   wherein the cooling unit includes a housing, a guide member, and a pump, wherein the housing covers the memory controller and includes a first point and a second point, wherein the first point is disposed at a first side of the housing, wherein the second point is disposed at a second side of the housing that is below the first side of the housing, wherein the guide member is attached to the housing and guides the flow of the cooling material from the first point toward the second point, and wherein the pump is configured to adjust an amount of the cooling material flowing from the first point to the second point, wherein the guide member includes a corner portion and a partition wall, wherein the corner portion is disposed in a corner region of the housing, and the partition wall is disposed to spirally extend inside the housing, and the cooling material flows toward the second point along the corner portion and the partition wall.

2. The storage device of claim 1, wherein:

the guide member has a spiral shape, and spirally guides the flow of the cooling material around the memory controller, and a number of times in which the cooling material comes into contact with the guide member is adjusted by the pump.

3. The storage device of claim 1, wherein:

the cooling unit further includes a first cover at the first point and configured to open and close and to adjust an inflow of the cooling material, and the first point is opened and the cooling material flows into the first point when a pressure due to the cooling material is applied to the first cover during an operating state of the pump.

4. The storage device of claim 3, wherein the cooling unit further includes a second cover configured to open and close, and disposed to correspond to the first cover in a diagonal direction.

5. The storage device of claim 4, wherein:

the first and the second covers each include an elastic member; and the first point is opened when the pressure due to the cooling material increases to more than elastic forces of the elastic members of the first and the second covers during the operating state of the pump.

6. The storage device of claim 1, wherein:

an inlet, through which the cooling material is introduced, is disposed at the first point; and an outlet, from which the cooling material is discharged to an outside of the housing, is disposed at the second point.

7. The storage device of claim 1, wherein the guide member includes a curved portion.

8. The storage device of claim 1, wherein the guide member includes an elastic material.

9. The storage device of claim 1, wherein the second point is disposed at a position corresponding to the memory controller.

10. The storage device of claim 1, wherein:

the cooling unit may further include an inlet through which the cooling material is introduced from an upper portion of the housing toward the memory controller, and the cooling material is introduced into the storage device from the inlet when an air pressure in the storage device is reduced by an operating state of the pump.

11. The storage device of claim 1, wherein a height of the guide member decreases as the second point is approached.

12. A storage device comprising:
a memory device;
a memory controller; and
a cooling unit configured to guide a flow of a cooling material to the memory controller, wherein the cooling unit includes a housing, a guide member, and a pump, wherein the housing covers the memory controller, wherein the guide member is attached to the housing and configured to spirally guide the flow of the cooling material so that the flow of the cooling material is directed toward the memory controller, and wherein the pump is configured to adjust an amount of the cooling material, wherein the guide member includes a corner portion and a partition wall, wherein the corner portion is disposed in a corner region of the housing, and the partition wall is disposed to spirally extend inside the housing, and the cooling material flows along the corner portion and the partition wall toward an outlet that is disposed at a position corresponding to the memory controller.

13. The storage device of claim 12, wherein a number of times in which the cooling material comes into contact with the guide member is adjusted by the pump.

14. The storage device of claim 12, wherein:

the cooling unit further includes a first cover and a second cover, wherein the first cover is configured to open and close and to adjust an inflow of the cooling material, wherein the second cover is configured to open and close and is disposed to correspond to the first cover in a diagonal direction, and a first and a second inlet are opened, when a pressure due to the cooling material is applied to the first and the second covers during an operating state of the pump and the cooling material is introduced into the opened first and second inlets.

15. A cooling system of a storage device comprising:
a memory device;
a memory controller; and
a cooling unit configured to guide a flow of a cooling material to the memory controller, wherein the cooling unit includes a housing, a guide member, and a pump, wherein the housing covers the memory controller and includes a first and a second inlet, an outlet, and a first and a second cover, wherein the cooling material is introduced through the first and the second inlets, wherein the cooling material is discharged from the outlet, wherein the first and the second covers are configured to open and close the first and the second inlets, respectively, wherein the guide member is attached to the housing and is configured to guide the flow of the cooling material toward the outlet, and wherein the pump is configured to adjust an amount of the cooling material, and wherein the flow of the cooling material around the memory controller is spirally guided by the guide member, and a number of times in which the cooling material comes into contact with the guide member is adjusted by controlling the pump.

16. The cooling system of claim 15, wherein a pressure of the cooling material is applied to the first and the second covers, and the first and the second inlets are opened and the cooling material is introduced into the first and the second inlets, during an operating state of the pump.

17. The cooling system of claim 15, wherein:

the first and the second covers each include an elastic member; and the first and the second inlets are opened when a pressure of the cooling material increases to more than elastic forces of the elastic members of the first and the second covers during an operating state of the pump.

18. The cooling system of claim 15, wherein:
the guide member includes a corner portion and a partition wall, wherein the corner portion is disposed in a corner region of the housing, and the partition wall is disposed to spirally extend inside the housing, and the cooling material flows along the corner portion and the partition wall toward the outlet.

\* \* \* \* \*